United States Patent [19]

Chang et al.

[11] Patent Number: 4,478,679
[45] Date of Patent: Oct. 23, 1984

[54] SELF-ALIGNING PROCESS FOR PLACING A BARRIER METAL OVER THE SOURCE AND DRAIN REGIONS OF MOS SEMICONDUCTORS

[75] Inventors: Jenq-Sian Chang, San Jose; Yih-Jau Chang, Cupertino, both of Calif.

[73] Assignee: Storage Technology Partners, Louisville, Colo.

[21] Appl. No.: 556,722

[22] Filed: Nov. 30, 1983

[51] Int. Cl.³ ............................ C23F 1/02; B44C 1/22; C03C 15/00; C03C 25/06
[52] U.S. Cl. ........................ 156/653; 29/571; 148/187; 156/656; 156/657; 156/659.1; 156/661.1; 427/90; 430/318
[58] Field of Search ............... 156/643, 646, 650, 652, 156/653, 656, 657, 659.1, 661.1, 662; 29/571, 580; 204/192 E; 427/88–90; 148/187; 357/23, 41, 49, 65, 71; 430/312, 313, 316, 317, 318; 252/79.1

[56] References Cited

U.S. PATENT DOCUMENTS

| | | | |
|---|---|---|---|
| 3,544,399 | 12/1970 | Dill | 156/657 X |
| 3,745,647 | 7/1973 | Boleky | 29/571 |
| 4,222,816 | 9/1980 | Noble et al. | 156/656 X |
| 4,412,885 | 11/1983 | Wang et al. | 156/656 X |

Primary Examiner—William A. Powell
Attorney, Agent, or Firm—Bryant R. Gold

[57] ABSTRACT

A self-aligning process for adding a barrier metal to the source and drain regions of metal oxide semiconductors is presented. An oxide sidewall spacer is first formed on the sides of upwardly protruding gate regions. A barrier metal is then added to the entire surface, followed by adding a layer of resist material. The resist material is added in layers with each layer spun until the top surface is nearly smooth. An anisotropical etch is done to remove the resist everywhere except over the source and drain regions, which regions are depressed due to the upwardly protruding gate region and a surrounding upwardly protruding insulating material. The exposed barrier metal is etched away and the remaining resist is stripped, leaving a layer of barrier metal only over the source and drain regions.

9 Claims, 6 Drawing Figures

SELF-ALIGNING PROCESS FOR PLACING A BARRIER METAL OVER THE SOURCE AND DRAIN REGIONS OF MOS SEMICONDUCTORS

BACKGROUND OF THE INVENTION

This invention relates to the fabrication of metal oxide semiconductor (MOS) integrated circuits (IC's). More particularly, it relates to a process for adding a barrier metal layer over the source and drain areas of MOS IC's. Even more particularly, it relates to a self-aligning process of adding such a barrier metal layer.

When an MOS integrated circuit chip is fabricated, it is one of many chips, arranged in an orderly array on a thin wafer of semiconductor material. The circuit elements, e.g., the sources, drains, gates, metallization, etc., that make up the IC are fabricated in a series of processing steps. Most processing steps require the use of a mask, typically a glass plate which has a pattern of clear and opaque areas. The pattern on the mask defines the area of the wafer that will be subjected to, or protected from, the next processing step.

Prior to a processing step that requires the use of a mask, the wafer is coated with a thin layer of photo sensitive material called a resist. The resist is exposed, by a variety of techniques, with the pattern of the mask. After exposure, the resist is developed in a manner similar to the development of photographic film. The developing process uncovers, or removes, the resist from those areas of the wafer that are to be subjected to the next step of the process, and leaves the resist in place to protect those areas which are not to be subjected to the next step.

When the sources, drains, and gates that make up the elements of the transistors of the IC have been fabricated, a mask is used to add one or more aluminum pads to each of the elements. A layer of insulating glass is then formed over the IC, and a resist/mask step is performed to allow an acid to etch through the glass over the pads, thereby exposing the pads. A mask corresponding to a desired interconnection pattern is then used to form metal traces over the remaining glass to interconnect the transistors via the exposed pads in the desired configuration. More than one layer of metal traces may be used, each separated by a layer of insulating glass.

The alignment of the mask used to perform the various steps described above is very critical. If the mask used in a particular process step is not aligned correctly with respect to previous patterns fabricated, the IC formed may not function correctly, e.g., the resulting IC may not operate fast enough, or it may not function at all.

As the IC technology has progressed to what is now called large scale integration (LSI) and very large scale integration (VLSI), the circuit elements became smaller and more dense. These smaller and more dense circuit elements of LSI and VLSI have significantly added to the alignment problem. Further, as IC technology has improved, the demand for faster circuits has also grown.

In the MOS technology, three important factors can be reduced to increase the speed performance of the circuits. These three factors are: (1) overlap capacitance; (2) contact resistance; and (3) junction depths.

In the prior art, the overlap capacitances between the gate and the source and between the gate and the drain are reduced by an oxide spacer, called a "snowpea" placed along the sides of the gate where it overlaps the source and drain regions. The use and fabrication of this "snowpea" is described more fully hereinafter.

Contact resistance was not a significant factor in increasing circuit speed until such time as the overlap capacitances were reduced. However, with the use of the "snowpea" to reduce capacitance, and with the advent of VLSI technology to produce smaller geometries, contact resistance has increased and has become a dominating factor.

Reducing junction depths is another way known in the art to increase circuit speeds. However, because aluminum migrates a small amount into silicon, great care must be exercised in order to prevent the aluminum pad formed over the source or drain regions from migrating all the way through the source or drain. If such a migration does occur, it causes an electrical short between the metal trace and the semiconductor material in which the source or drain is formed, thereby preventing the transistor from functioning. This is called "junction spiking." Prior to the use of shallow junctions, the junction was thick enough to prevent the aluminum from migrating far enough thereinto to cause junction spiking to occur. Unfortunately, the amount of migration is enough, however, to limit the use of shallow junctions. That is, if the migration is not prevented, the junctions will have to be made deeper than may be desired, and, therefore, the circuits will be slower than desired.

In the prior art, the problem of junction spiking and contact resistance is solved by covering the source and drain areas with a thin layer of a refractory metal, such as nickel, and covering the refractory metal with a layer of aluminum. The refractory metal, called a "barrier metal," does not migrate into the silicon of the source and drain. In addition, aluminum does not migrate into the refractory metal. Thus, the refractory metal acts as a barrier between the aluminum and the shallow junction. The layer of aluminum on the barrier metal replaces the pad previously used. Because of its larger area, it also reduces the contact resistance to an acceptable level.

Disadvantageously, in the prior art, the barrier metal and aluminum are added through the use of resists and masks. If the mask used to add the barrier metal is not in alignment with the source and drain, a portion of the source and drain may not be covered with the barrier metal. When the aluminum is added, the mask used may be slightly out of alignment with respect to the barrier metal. The aluminum can then come in contact with the shallow junction and junction spiking may occur.

One solution to this problem is to make the aluminum area smaller than the barrier metal area. However, doing this may cause the contact resistance to be higher than desired. Moreover, this requires the use of a mask to add the barrier metal, and this is an additional step that adds to the expense of fabricating the IC.

From the above, it is evident that a need exists in the art of MOS IC fabrication for a process or method that can add a barrier metal over the source and drain regions that is self-aligning and that does not require a masking step. Such a process would allow the use of shallow junctions without concern for the hazard of junction spiking.

SUMMARY OF THE INVENTION

It is an object of the present invention to provide an improved process for adding a barrier metal layer to the source and drain areas of MOS IC's.

It is a further object of the invention to provide such a barrier-metal adding process that does not require the use of a mask.

It is still a further object of the invention to provide such a process wherein the barrier metal layer is self-aligned with the source and drain areas.

The above and other objects of the invention are realized through a process that comprises the following steps:

1. A spacer (snowpea) is formed on the sides of the gate.
2. A layer of suitable barrier metal is deposited over the entire surface of the IC.
3. Layers of resist, or other suitable organic material, having the appropriate viscosity are added and spun after each addition until the surface of the resist is smooth.
4. An anisotropical etch is done until the layer of barrier metal is exposed everywhere except over the source and drain areas. (An anisotropical etch is one wherein all the material being etched is etched to the same depth.) The resist over the source and drain regions remains because of the natural depressions in the surface of the IC when the source and drain are formed therein. Thus, these depressed regions still contain resist when the etching is stopped.
5. The exposed barrier metal is etched away.
6. The resist over the source and drain areas is chemically removed.

The result of the process summarized above is a layer of barrier metal that covers the source and drain areas of the IC and overlaps slightly onto the snowpea and the field or insulating area around the source and drain. Advantageously, no masks are used. Self-alignment is guaranteed since the invention takes advantage of the topography of the IC to cause alignment. That is, alignment is caused by the source and drain themselves, i.e., the depressions in the surface of the IC created when the source and drain are fabricated.

BRIEF DESCRIPTION OF THE DRAWINGS

The above and other objects, features, and advantages of the present invention will become more apparent from the following more particular description of the preferred embodiment, given in conjunction with the following drawings, wherein.

DESCRIPTION OF THE PREFERRED EMBODIMENT

The following is a description of the best presently contemplated mode of carrying out the present invention. This description is given only to illustrate the general principles of the invention and is not to be taken in a limiting sense. To ascertain the true scope of the invention, reference should be made to the appended claims.

Figure 1:
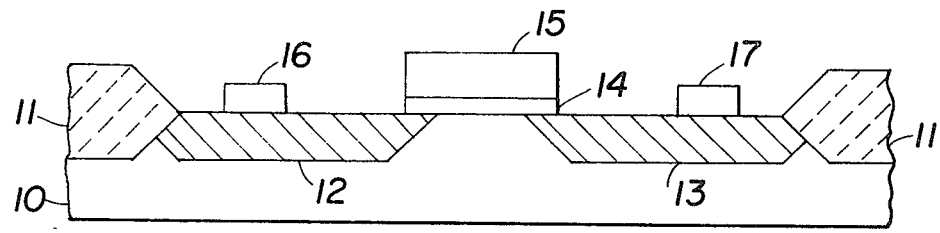
FIG. 1 is a cross-sectional drawing through an MOS transistor of the prior art showing the various elements that make up the transistor.

FIG. 1 is a cross-sectional drawing through an MOS transistor of the prior art showing the various elements that make up the transistor and their relationship to each other. A source region 12 and drain region 13 are embedded (diffused) in a semiconductor material 10. The source 12 and drain 13 could be N+ or P+ material and the semiconductor material 10 could be P− or N− material, respectively, depending upon whether the transistor is an N channel or P channel transistor, respectively.

A field oxide region 11 surrounds the periphery of the source 12 and drain 13 and electrically isolates or insulates them from adjacent elements. Thus, the field oxide region 11 is sometimes referred to as an insulating region. A gate 15 is formed on an insulating oxide area 14 such that it extends over the source 12 and drain 13 regions. Aslo shown in FIG. 1 are two aluminum pads 16-17 over the source 12 and drain 13. These pads 16-17 are used when metal traces are added to interconnect the transistors.

FIG. 1 illustrates the fact that when an MOS transistor is fabricated, the source region 12 and drain region 13 form a depression. That is, although the figure is not drawn to scale, the top surface of the field oxide region 11 and the top surface of the gate region 15 will be at a higher level than the top surfaces of the source 12 and drain 13. That is, the field oxide or insulating region 11 and the gate region 15 protrude upwardly from the top surface of the source and drain regions 12 and 13. In a top view, the source 12 and drain 13 would appear as rectangles, each of which has three sides bounded by the field oxide 11 and one side bounded by the gate 15. The techniques used to fabricate the MOS transistor are well understood by those knowledgeable in the art of MOS IC fabrication.

Figure 2:
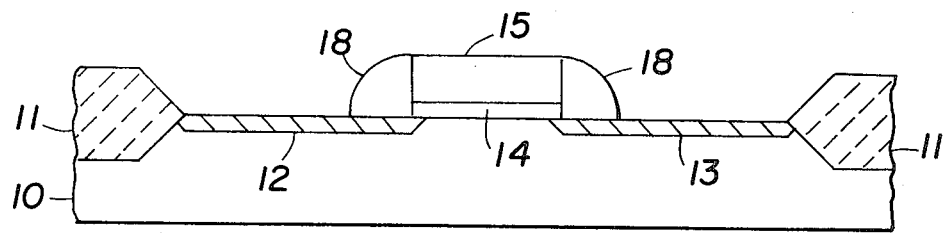
FIG. 2 is a cross-sectional drawing through a shallow junction MOS transistor showing the snowpea added as the first step of the process of the present invention.

FIG. 2 is a cross-sectional drawing through a shallow junction MOS transistor showing the first step of the process of the present invention. Like elements are numbered the same as in FIG. 1, and will also be numbered the same in the remaining figures. Although the figures are not drawn to scale, it is to be emphasized that the thickness of the source 12 and drain 13 in FIG. 2 is considerably less than those of FIG. 1. Also, it should be pointed out that although the figures used in this description are drawn with straight lines and rounded curves, they only represent the transistor cross section. A true cross section of a transistor would not appear nearly as smooth and linear.

The first step in the process of the present invention is to add the "snowpea" 18. As explained previously, the snowpea is an oxide spacer used to reduce the capacitance between the sides of the gate 15 and the source 12 and drain 13. In the case of the present invention it also serves as an electrical insulator between the barrier metal layer that will be added and the gate 15.

The snowpea is added without a mask by a process known in the art. An oxide is deposited or grown over the entire surface of the wafer. Because the oxide deposits or grows out from the side of the gate 15 as it also deposits or grows up from the surface of the source 12 and drain 13, the vertical oxide dimension is larger in the area occupied by the snowpea than elsewhere. An anisotropical etch using a freon and oxygen plasma is used to remove the oxide until the top surfaces of the gate 15, source 12 and drain 13 are free of oxide. The snowpea remains since the oxide was thicker in that particular region.

Figure 3:
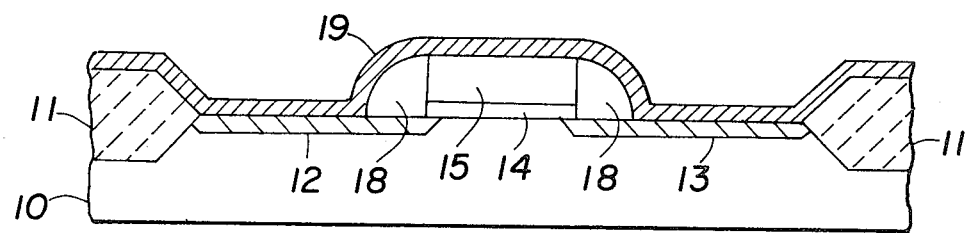
FIG. 3 shows the MOS transistor of FIG. 2 after a barrier metal layer is added as the second step of the process of the present invention.

FIG. 3 is a cross-sectional drawing showing the transistor of FIG. 2 after a barrier metal layer 19 is added as the second step of the process of the invention. The barrier metal used may be any suitable refractory metal, such as nickel or tungsten. It is deposited as a thin film with a thickness of approximately 1500 angstroms by any convenient method, such as by sputtering, evaporation, or chemical vapor deposition (CVD). The barrier metal is deposited over the entire surface of the wafer and therefore, its application does not require a mask.

Figure 4:
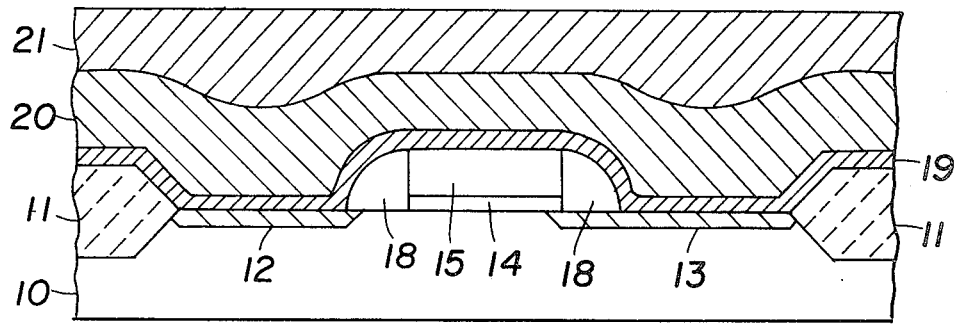
FIG. 4 shows the MOS transistor of FIG. 3 after a layer or layers of resist is added as the third step of the process of the present invention.

FIG. 4 is a cross-sectional drawing showing the transistor of FIG. 3 after a resist material 20-21 is added as the third step of the process of the invention. FIG. 3 shows two layers of resist 20-21. A resist, or other suitable organic material, with the appropriate viscosity, such as AZ 1300 or AZ 1400 resists or a polyimide, is applied as the first layer 20. The wafer is spun, and the resist, because of its viscosity, tends to smooth out in the depressions formed by the source 12 and drain 13. This "smoothing out" is represented in FIG. 4 by the solid line between layers 20 and 21. The second layer of resist or other material 21 is added and the wafer is again spun. The depressions of the source 12 and drain 13 are thereby smoothed out even further. In the figure, the top surface of layer 21 is shown as flat.

In developing the present invention, it was found that two layers of resist, each spun after its application, was sufficient to give a smooth enough surface for the next step of the process. Depending upon the viscosity of the particular resist used, more or less layers may be required. Since the resist is applied over the entire surface of the wafer, no mask is required.

Figure 5:
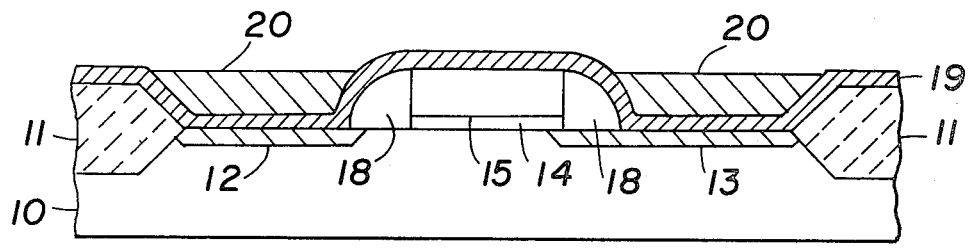
FIG. 5 shows the MOS transistor of FIG. 4 after a prescribed depth of the resist layer(s) is etched away as a result of the fourth step of the process of the present invention.

FIG. 5 is a cross-sectional drawing showing the transistor of FIG. 4 after the fourth step of the process of the invention has been performed. In this step, the wafer is subjected to an anisotropical etch using gas phase plasmas, such as an oxygen plasma. The etching is performed until the top surfaces of the barrier metal 19 that covers the field oxide 11 and gate 15 are exposed. As shown in FIG. 5, the resist 20 covering the source 12 and drain 13 is not removed by the etching. Because the resist is removed uniformly from the entire surface of the wafer, no mask is required.

Figure 6:
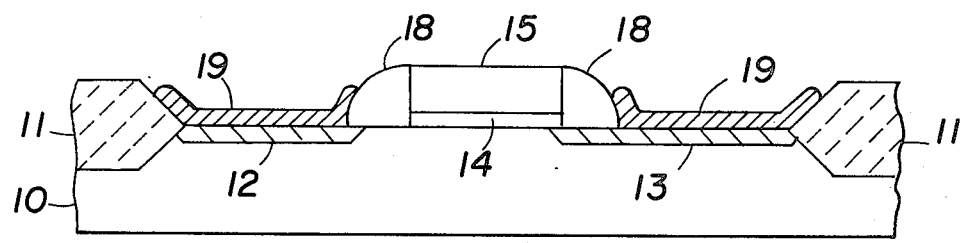
FIG. 6 shows the MOS transistor of FIG. 5 after the exposed barrier metal layer is etched away and the remaining resist removed by fifth and sixth steps, respectively, of the process of the present invention.

FIG. 6 is a cross-sectional drawing showing the transistor of FIG. 5 after the fifth and sixth steps of the process of the invention have been completed. The fifth step comprises effectuating a dry or wet etch of the exposed barrier metal layer using a suitable etchant for the refractory metal used. Thus, this step removes all of the barrier metal layer except that protected by resist (i.e., that overlaying the drain and source regions). The sixth step is to chemically remove the remaining resist or other material over the source region 12 and drain region 13. A number of processes, such as an oxygen plasma etch, can be used for this purpose. Advantageously, both steps are performed without a mask.

FIG. 6 further illustrates the advantage of the process of the present invention. The source region 12 and drain region 13 are not only completely covered by the barrier metal layer; the metal also overlaps the snowpea 18 and field oxide region 11. (The barrier metal layer also overlaps the field oxide at the two ends of the rectangular shaped source region 12 and drain region 13, which are not shown in the figure.)

In summary, a process has been disclosed whereby, without the use of masks but rather by a unique use of the topography of an MOS IC, a barrier metal layer is added to the surface of the source and drain regions that totally covers them. Moreover, the barrier metal layer is guaranteed to be aligned with the source and drain since the depressions of the source and drain provide the needed alignment. The barrier metal layer can then be covered with a layer of aluminum to lower the contact resistance, through the use of a mask, without the hazard of junction spiking being present.

What is claimed is:

1. In the fabrication of metal oxide semiconductors, a self-aligning process method for adding a barrier metal layer over source and drain regions of said semiconductors, after said semiconductors have been formed but before any metal contacts used in the interconnection of said semiconductors are added, said formed semiconductors including a substrate, spaced-apart source and drain regions embedded into said substrate, an upwardly protruding gate region overlying the space between respective source and drain regions, and an upwardly protruding insulating region overlying the surface of said substrate everywhere except over said source, drain and gate regions, whereby depressions are formed over said source and drain regions as defined by the upwardly protruding insulating and gate regions, said self-aligning method comprising the steps of:
   (a) placing a layer of oxide over the entire surface of said semiconductors;
   (b) removing all of said oxide except that oxide placed on the sides of the upwardly protruding gates of said semiconductors;
   (c) placing a layer of barrier metal over the entire surface of said semiconductor;
   (d) placing a layer of organic material over said barrier metal, said layer of organic material being applied until an upper surface of said organic material is substantially smooth and free of depressions;
   (e) removing said layer of organic material until said barrier metal is exposed everywhere except over said depressed source and drain regions, where said organic material remains in said depressions;
   (f) removing the exposed barrier metal from the surface of said semiconductors; and
   (g) removing the remaining organic material, thereby leaving said barrier metal on the surfaces of said source and said drain regions.

2. The self-aligning method of adding a barrier metal layer of claim 1 wherein step (d) comprises:
   (1) depositing a first layer of said organic material over the surface of said semiconductor;
   (2) spinning said semiconductor to smooth out the depressions caused by said depressed source and drain regions;
   (3) depositing a second layer of said organic material over the surface of said first layer; and (4) spinning said semiconductor to further smooth out any depressions caused by the underlying depressed source and drain regions.

3. The self-aligning method of adding a barrier metal layer of claim 2 wherein said organic material comprises a resist material having a desired viscosity, whereby any sharp depressions in the surface of the semiconductor will be smoothed by said viscous resist material when the semiconductor is spun.

4. The self-aligning method of adding a barrier metal layer of claim 1 wherein step (b) comprises performing an anisotropical etch in order to remove all of said oxide except that on the sides of the upwardly protruding gate region.

5. The self-aligning method of adding a barrier metal layer of claim 1 wherein step (e) comprises performing an anisotropical etch of said organic material in order to remove it until said barrier metal is exposed everywhere except over the depressed source and drain regions.

6. The self-aligning method of adding a barrier metal layer of claim 1 wherein the removing of material or layers performed in steps (b), (e), and (f) is performed through an etching process.

7. The self-aligning method of adding a barrier metal layer of claim 1 wherein the placing of materials or layers performed in steps (a), (c) and (d) is performed through a deposition process.

8. In the fabrication of metal oxide semiconductors, a self-aligning process method for adding a barrier metal layer over source and drain regions of said semiconductors, after said semiconductors have been formed but before any metal contacts used in the interconnection of said semiconductors are added, said formed semiconductors including a substrate, spaced-apart source and drain regions embedded into said substrate, an upwardly protruding gate region overlying the space between respective source and drain regions, and an upwardly protruding insulating region overlying the surface of said substrate everywhere except over said source, drain and gate regions, whereby depressions are formed over said source and drain regions as defined by the upwardly protruding insulating and gate regions, said self-aligning method comprising the steps of:

(a) placing a layer of barrier metal over the entire surface of said semiconductor;

(b) placing a layer of organic material over said barrier metal, said layer of organic material being applied until an upper surface of said organic material is substantially smooth and free of depressions;

(c) removing said layer or organic material until said barrier metal is exposed everywhere except over said depressed source and drain regions, where said organic material remains in said depressions;

(d) removing the exposed barrier metal from the surface of said semiconductors; and (e) removing the remaining organic material, thereby leaving said barrier metal on the surfaces of said source and said drain regions.

9. The self-aligning method of adding a barrier metal layer of claim 8 wherein step (b) comprises:

(1) depositing a first layer of said organic material over the surface of said semiconductor; and (2) spinning said semiconductor to smooth out the depressions caused by said depressed source and drain regions.

* * * * *